United States Patent
Komatsu et al.

(10) Patent No.: US 7,964,335 B2
(45) Date of Patent: *Jun. 21, 2011

(54) INK RECEPTIVE PHOTOSENSITIVE LAMINATE

(75) Inventors: Toshifumi Komatsu, Duluth, MN (US); Kyle Johnson, Duluth, MN (US); William Charles Ulland, Duluth, MN (US)

(73) Assignee: Ikonics Corporation, Duluth, MN (US)

( * ) Notice: Subject to any disclaimer, the term of this patent is extended or adjusted under 35 U.S.C. 154(b) by 895 days.

This patent is subject to a terminal disclaimer.

(21) Appl. No.: 10/060,753

(22) Filed: Jan. 30, 2002

(65) Prior Publication Data

US 2003/0148217 A1  Aug. 7, 2003

(51) Int. Cl.
*G03F 7/00* (2006.01)
*G03F 7/26* (2006.01)
*G03F 7/32* (2006.01)

(52) U.S. Cl. ............... 430/306; 430/270.1; 430/302; 430/322; 430/434

(58) Field of Classification Search .......... 430/270.1, 430/271.1, 273.1, 281.1, 302, 306, 308, 309, 430/494, 434
See application file for complete search history.

(56) References Cited

U.S. PATENT DOCUMENTS

| | | | |
|---|---|---|---|
| 4,456,680 A | 6/1984 | Nakamura et al. | 430/258 |
| 4,587,186 A | 5/1986 | Nakamura et al. | 430/14 |
| 4,764,449 A | 8/1988 | VanIseghem | 430/162 |
| 4,853,317 A | 8/1989 | Hayes | 430/318 |
| 4,858,394 A | 8/1989 | Lalumiere et al. | 51/312 |
| 5,093,160 A | 3/1992 | Johnson et al. | 427/358 |
| 5,260,173 A | 11/1993 | Birkholm | 430/325 |
| 5,334,485 A | 8/1994 | Van Iseghem et al. | 430/287 |
| 5,346,577 A | 9/1994 | Johnson et al. | 156/308.8 |
| 5,366,584 A | 11/1994 | Zukowski et al. | 156/642 |
| 5,370,762 A | 12/1994 | Zukowski et al. | 156/154 |
| 5,415,971 A | 5/1995 | Couture et al. | 430/260 |
| 5,427,890 A * | 6/1995 | Suzuki et al. | 430/263 |
| 5,506,089 A | 4/1996 | Gybin et al. | 430/287 |
| 5,637,426 A | 6/1997 | Uchikawa | 430/9 |
| 5,645,975 A | 7/1997 | Gybin et al. | 430/308 |
| 5,654,032 A | 8/1997 | Gybin et al. | 427/140 |
| 5,677,110 A * | 10/1997 | Chia et al. | 430/302 |
| 5,922,506 A * | 7/1999 | Hoogmartens et al. | 430/273.1 |
| 5,925,500 A * | 7/1999 | Yang et al. | 430/300 |
| 5,989,689 A | 11/1999 | Komatsu | 428/201 |
| 6,020,436 A | 2/2000 | Gybin et al. | 525/279 |
| 6,037,106 A | 3/2000 | Komatsu | 430/323 |
| 6,106,992 A * | 8/2000 | Asano et al. | 430/270.1 |
| 6,140,005 A * | 10/2000 | Van Damme et al. | 430/156 |
| 6,140,006 A | 10/2000 | Komatsu et al. | 430/156 |
| 6,143,470 A * | 11/2000 | Nguyen et al. | 430/273.1 |
| 6,235,449 B1 | 5/2001 | Souders et al. | 430/273.1 |
| 6,248,498 B1 | 6/2001 | Gybin | 430/176 |
| 6,413,700 B1 * | 7/2002 | Hallman et al. | 430/302 |
| 2002/0037475 A1 * | 3/2002 | Taguchi et al. | 430/273.1 |

FOREIGN PATENT DOCUMENTS

EP  0 506 959 B1  9/2000
JP  55-157737  12/1980

* cited by examiner

*Primary Examiner* — Amanda C. Walke
(74) *Attorney, Agent, or Firm* — Pauly, Devries, Smith & Deffner, L.L.C.

(57) ABSTRACT

The present invention is directed to an ink receptive film and methods of using the ink receptive film. The ink receptive film is generally suitable for etching patterns into substrates, and typically includes a photosensitive laminate structure containing at least an ink receptive, radiation transmissive layer; and at least one photosensitive resist layer.

3 Claims, 1 Drawing Sheet

INK RECEPTIVE PHOTOSENSITIVE LAMINATE

FIELD OF THE INVENTION

The present invention is directed to an ink receptive film and methods of using the ink receptive film. More particularly, the invention is directed to an ink receptive photosensitive laminate, methods of using the ink receptive photosensitive laminate, and to products made using the ink receptive photosensitive laminate.

BACKGROUND

Photosensitive laminates have been used for years to create imageable patterns useful for etching of substrate materials. These photosensitive laminates comprise a photosensitive material which, upon selective exposure to light of an appropriate wavelength range, forms regions of two distinct types: regions which are easily removable by a developer liquid and regions which are not easily removable by the developer liquid. After developing with the developer liquid, these removable and non-removable regions then form void areas and mask areas in the photosensitive material. The developed photosensitive laminate can then be applied to a target surface and exposed to an etching material, such as a particulate abrasive. The void areas allow the particulate abrasive media to strike the target surface, while the mask areas protect the underlying target surface from the particulate abrasive.

The photosensitive materials used in the laminates can be selectively exposed to light using various methods, of which one common method is stacking a light-blocking stencil onto the laminate. The stencil contains a pattern corresponding to the portions of the laminate that are to be removed (in photonegative applications), and thus should not be exposed to light. The stencil is held in place over the unexposed photosensitive laminate (such as under a transparent glass sheet and with a vacuum table) and then the stencil and laminate are exposed to light of the correct wavelength, intensity, and duration to react the exposed portions of the laminate. The stencil is subsequently removed and the laminate film developed. In this manner, high definition patterns can be transferred to the laminates. Thereafter, the laminate structure can be used for screen printing, abrasive etching, chemical etching, or other specific applications.

Although traditional methods of forming a pattern with a stencil placed on the photosensitive laminate are satisfactory for many applications, a need exists for improved materials and methods. In particular, a need exists for materials and methods that simplify the process of making imaged patterns in polymeric films and which do not require use of a stencil.

SUMMARY OF THE INVENTION

The present invention is directed to improved photosensitive laminates suitable for use in etching processes, such as particulate etching processes. More particularly, the invention is directed to ink receptive photosensitive laminates, methods of using the ink receptive photosensitive laminates, and to products made using the ink receptive photosensitive laminates. The photosensitive laminates contain at least one layer of photosensitive material, typically a photosensitive resist resin, which can be selectively exposed to actinic radiation (normally ultraviolet light). The laminates also generally include an ink receptive, radiation transmissive layer that is positioned over the photosensitive material and secured to the laminate. Mask patterns can be directly formed on this ink receptive layer without forming a stencil, thus avoiding the need to produce a separate stencil sheet, and also avoiding the steps of securing the stencil sheet to the photosensitive material.

Generally the ink receptive, radiation transmissive layer can be printed on with inks, such as water-soluble inks, without deterioration, but is water soluble and removable under some conditions. Thus, the ink receptive, radiation transmissive layer can receive ink (including water-based ink), yet can be removed during the development process. Development typically includes exposing the laminate to moving water, usually warm moving water delivered under pressure.

The ink receptive layer should be sufficiently light transmissive that it allows light to pass through with enough intensity to expose underlying unmasked photosensitive layers. The ink receptive layer is desirably transparent, but can also be partially opaque as long as sufficient light can pass through to react the photosensitive layer or layers. The ink receptive, radiation transmissive layer can also be configured such that it provides anti-block properties, thereby preventing multiple laminates from sticking together.

The photosensitive material can be formed into one or more than one layer. Normally the photosensitive material is contained in an adhesive layer and a non-adhesive layer. Thus, the adhesive layer is preferably also photosensitive. In certain implementations the photosensitive laminate contains at least two photosensitive layers, including a first tacky photosensitive layer and a second substantially non-tacky photosensitive layer. The tacky photosensitive layer provides adhesion to a substrate, such as a substrate that is to be etched. In some implementations the tacky photosensitive layer is under adjacent to the ink receptive layer.

The laminate also generally includes a carrier layer that holds the other layers prior to their being placed on a substrate. Thus, the photosensitive laminate structure usually contains an ink receptive, radiation transmissive layer; at least one photosensitive layer; and a carrier layer. A membrane layer may also be included and is placed between the carrier and photosensitive layers. Additional layers can be included without deviating from the scope and intent of the invention, including layers placed between the layers discussed herein as long as they do not eliminate the functionality described herein. In general the laminate is constructed so that it will pass through a printer that can take thick paper, known as "cardstock". However, the laminate can be relatively thick or thin and is not limited to a specific thickness. In certain embodiments of the invention the ink receptive, radiation transmissive layer is receptive to inkjet ink and can be used in an inkjet printer.

The invention is also directed to methods of exposing a photosensitive laminate without use of a stencil. In some implementations the method comprises providing a multilayer laminate containing at least one ink receptive, light transmissive layer and one or more photosensitive layers. An image is printed directly onto the ink receptive layer (such as by using an inkjet printer). The image corresponds to those portions of the photosensitive layer that will not be exposed to light. The laminate is subsequently exposed to an appropriate range of wavelengths of light, and then developed. Generally, the laminate is developed by spraying with water under pressure, although other solvents can be used. The ink receptive layer is preferably dissolvable or removable during development to expose a photosensitive layer, typically the tacky photosensitive layer. Alternatively, the ink receptive material is constructed and arranged to be peelable from the photosensitive layer. In such implementations it may be necessary to apply a release liner or release coating between the ink receptive layer and the photosensitive layer.

The above summary of the present invention is not intended to describe each disclosed embodiment of the present invention. This is the purpose of the figures and the detailed description which follow.

BRIEF DESCRIPTION OF THE FIGURES

Other aspects and advantages of the invention will become apparent upon reading the following detailed description and upon reference to the drawing in which.

Figure 1:
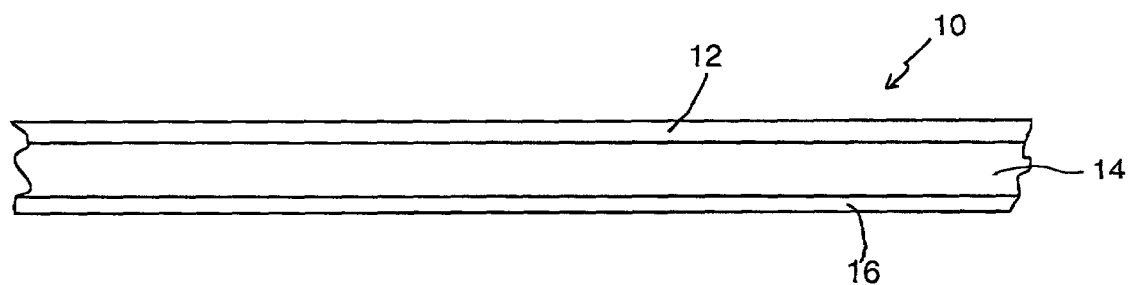
FIG. 1 is a side plan view of a first ink receptive photosensitive film constructed and arranged in accordance with the invention.

While the invention is susceptible to various modifications and alternative forms, specifics thereof have been shown by way of example in the figure and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is directed to improved photosensitive laminates and methods of using the laminates. More particularly, the invention is directed to ink receptive photosensitive laminates, methods of using the ink receptive photosensitive laminates, and to products made using the ink receptive photosensitive laminates. The photosensitive laminates contain at least one layer of photosensitive material, typically a photosensitive resin, which can be selectively exposed to actinic radiation (normally ultraviolet light) without use of a separate stencil, and an ink receptive light transmissive layer.

The general configuration of laminates made in accordance with the invention will now be described, along with more specific descriptions of the layers used in various implementations of the invention.

I. General Laminate Configuration

The improved photosensitive laminates of the invention generally include at least two layers, and more typically three or more layers. The laminates normally contain an ink-receptive light transmissive layer that is also water soluble or water degradable, along with a light sensitive layer that reacts when exposed to light (and subsequent development). In certain embodiments of the invention the ink receptive, radiation transmissive layer is receptive to inkjet ink and can be used in an inkjet printer. The ink receptive, radiation transmissive layer frequently also provides anti-block properties that avoid having multiple laminates stick together.

Additional layers besides the ink receptive layer and single photosensitive layer are usually present. For example, more than one photosensitive layer is frequently used. The photosensitive layers can be various thicknesses and are not necessarily the same thickness. In addition, the separate photosensitive layers can be formed of different compositions, and can have different glass transition temperatures (correlating to different degrees of stickiness or hardness). For example, two photosensitive layers can be used in implementations where a first thick layer is harder (higher $T_g$) than a second thinner layer (with lower $T_g$). The low $T_g$ layer serves as a pressure sensitive adhesive (PSA) to secure the laminate to a substrate during etching, while the higher $T_g$ layer is the primary material forming a pattern that resists etching of the substrate.

Other additional layers that are commonly included with various implementations of the invention are carrier layers and membrane layers. The carrier layers support the laminate during use and also covers and keeps it clean prior to application on a substrate. A membrane layer is often applied between the carrier and photosensitive layer to help removal of the carrier layer from the rest of the laminate.

Figure 2:
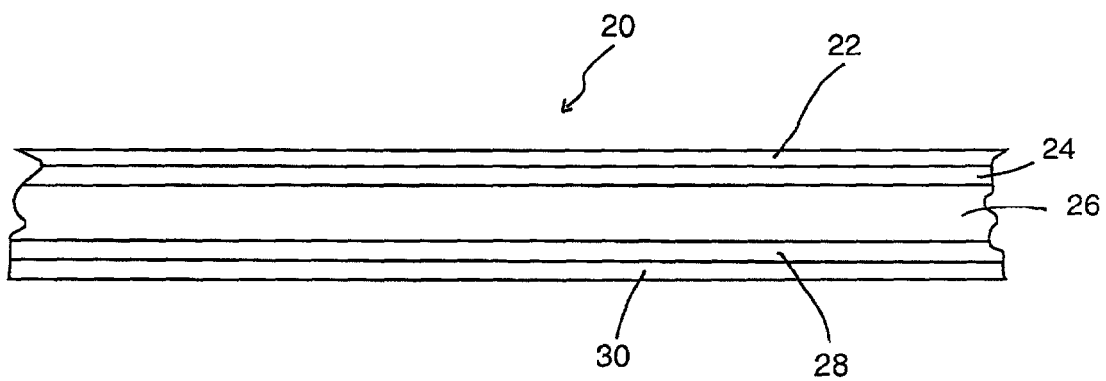
FIG. 2 is a side plan view of a second ink receptive photosensitive film constructed and arranged in accordance with the invention.
Figure 3:
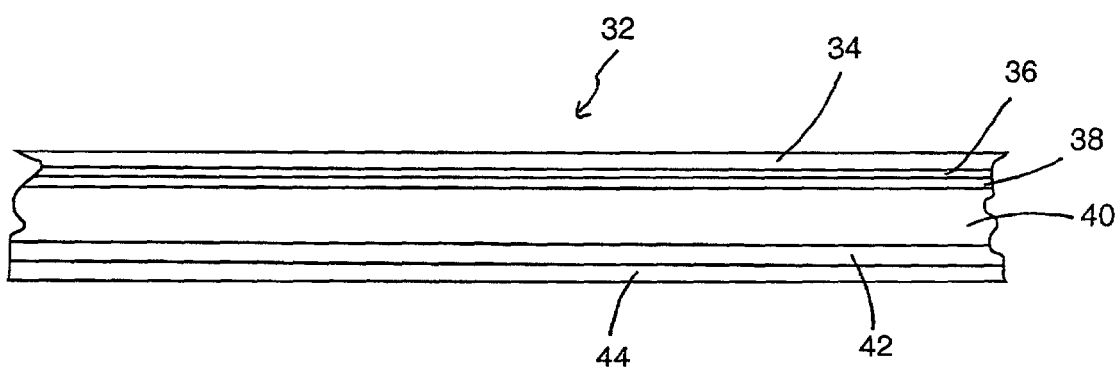
FIG. 3 is a side plan view of a third ink receptive photosensitive film constructed and arranged in accordance with the invention.

In reference now to the figures, FIG. 1 through FIG. 3 show example configurations for laminates made in accordance with the invention. It will be appreciated, however, that other configurations are contemplated and thus these specific depicted examples are provided to illustrate some configurations of suitable laminates without limiting the invention to these configurations.

In FIG. 1, laminate 10 includes ink receptive layer 12, photosensitive layer 14, and carrier 16. In FIG. 2, laminate 20 includes ink receptive layer 22, first photosensitive layer 24 (more tacky layer), second photosensitive layer 26 (less tacky layer), membrane layer 28, and carrier layer 30. In FIG. 3, laminate 32 includes an ink receptive film 34, a release layer 36, a first photosensitive layer 38, a second photosensitive layer 40, a membrane layer 42, and a carrier layer 44.

Generally the ink receptive, radiation transmissive layer can be exposed to ink without deterioration, but is water soluble under some circumstances. Thus, the ink receptive, radiation transmissive layer can receive ink (including water-based ink), yet can be removed during the development process. Development typically includes exposing the laminate to moving water, usually warm moving water delivered under pressure. The ink receptive layer should be sufficiently light transmissive that it allows light to pass through in sufficient intensity to expose underlying photosensitive layers. The ink receptive layer is desirably transparent, but can also be partially opaque as long as sufficient light can pass through to react the photosensitive layers. The ink receptive, radiation transmissive layer can also be configured such that it provides anti-block properties, thereby preventing multiple laminates from sticking together.

The photosensitive laminate can be manufactured in a sheet or roll form that can be readily placed in a printer. For example, sheets of the laminate can be constructed so that they are suitable for printing in the tray of an inkjet printer. In general the laminate is constructed so that it will pass through a printer that can take thick paper, known as "cardstock". Generally it is desirable if the printer is able to print on paper greater than 3 mils thick, more typically greater than 8 mils thick, and even more typically greater than 13 mils thick.

II. Ink Receptive Layer

The ink receptive layer should be receptive to an ink composition that will block or substantially block the transmission of UV light. For example, in certain embodiments, the ink can be a black inkjet ink that is water soluble. Such ink can be removed during development, typically at the same time that the ink receptive layer is removed (if it is removed). The ink receptive layer should retain ink without excessively streaking or bleeding. Thus, the laminate should be able to be freely handled after application of the ink (allowing time to dry). Also, the ink receptive layer typically provides anti-block characteristics for the laminate.

In some implementations, the ink receptive layer can be removed from the laminate during development. In this regard, the ink receptive layer is water soluble. The layer can dissolve into the developer or break down into small pieces that are easily removed. In yet other implementations, the application of developer permits the ink receptive layer to be removed in a single piece.

The ink receptive layer should be thick enough to retain ink yet not so thick that it cannot be easily removed. Thus, it is generally desirable to make the ink receptive layer as thin as possible. In most implementations, the ink receptive layer is less than 5 mils thick, more frequently less than 1.5 mils thick, and even more frequently less than 1.0 mils thick. However, it will be appreciated that suitable ink receptive layers can be much thicker if they allow passage of sufficient light and if they are either removable from the laminate or do not interfere with the etching process.

The ink receptive, radiation transmissive layer is usually configured such that it provides anti-block properties, thereby preventing multiple laminates from sticking together. The ink receptive layer also prevents blocking in certain implementations of the invention. Thus, the ink receptive layer allows multiple laminates to be stacked together without having a release film covering the top of each laminate, which avoids having to remove an additional layer prior to use of the laminate film.

As used herein, to be "light transmissive" means to allow transmission of enough light to adequately react the photosensitive material beneath the ink receptive layer. In some implementations the "light transmissive layer" will be almost completely transparent, while in other implementations the layer will be substantially opaque yet still be able to transmit sufficient light to react the photosensitive material in a timely manner. It is desirable that the light transmissive layer be as transparent as possible, particularly as transparent as possible to light of the wavelengths that react the photosensitive material ("actinic radiation").

As used herein, to be water soluble or water removable means that the layer can be readily removed or dissolved when exposed to water or an aqueous solution. In some implementations of the invention the ink receptive layer is sufficiently water soluble that it dissolves in warm, moving water. In other implementations the ink receptive layer does not completely dissolve in water but is still readily removable from the laminate.

Various materials may be used for forming the ink receptive, light transmissive layer. The ink receptive, light transmissive layer can be formed of a wide variety of materials as long as it can receive and retain ink and is light transmissive. Generally it is also desirable that the material prevent blocking. In most implementations of the invention the ink receptive layer contains a water soluble polymer (such as polyvinyl alcohol) and inorganic or inorganic particles (or a combination of inorganic and organic particles). The inorganic particles can be, for example, calcium carbonate. The organic particles can be, for example, a polyethylene dispersion or emulsion.

In some implementations the amount of water soluble polymer is from 20 to 40 percent by weight of the ink receptive material, and more commonly less than 50 percent by weight of the ink receptive material, although quantities outside of these ranges are also acceptable in some embodiments. In some implementations the amount of inorganic particulates (when used) are from about 5 to 10 percent by weight of the ink receptive material, more commonly less than 10 percent, typically less than 20 percent, and usually less than 40 percent of the ink receptive material, although amounts outside of these ranges are also suitable to some implementations. The amount of organic particulates (when used) can also vary, and can be from 10 to 30 percent by weight of the ink receptive material, and is typically less than 40 percent by weight of the ink receptive material, although amounts outside of these ranges are suitable in some implementations.

Suitable ink receptive layers include, for example, films containing calcium carbonate and various inorganic or organic particulates, such as polyethylene dispersions, silica, alumina, and starches. Other suitable materials include, for example, water soluble and water insoluble materials, such as polyvinyl pyrrolidone, polyacrylic acid, water soluble derivatives of cellulose, polyvinyl alcohols, polyvinyl acetate, and ethylene vinyl chloride copolymer emulsions.

Suitable ink receptive layers made in accordance with the invention are described below as examples.

| Example Ink Receptive Layer I | |
|---|---|
| Material | Wt. % |
| polyvinyl alcohol[1] | 37.83 |
| water | 32.72 |
| polyvinyl acetate homopolymer[2] | 16.70 |
| isopropyl alcohol | 7.63 |
| SL-300, polyethylene dispersion[3] | 2.78 |
| polyvinyl alcohol[4] | 2.22 |
| Keyamine violet KB 220%, diazo dye[5] | 0.07 |
| fluorosurfactant[6] | 0.05 |

[1]PVA 52-22, 16.83% solution of polyvinyl alcohol in water, available from DuPont, Wilmington, DE.
[2]XR-2223, polyvinyl acetate homopolymer, available from H. B. Fuller Company, St. Paul, MN.
[3]SL-300, polyethylene dispersion, available from Elementis, Hightstown, NJ.
[4]PVA 51-05, 25% solution of polyvinyl alcohol in water, available from DuPont, Wilmington, DE.
[5]available from Keystone Aniline, Chicago, IL.
[6]Zonyl FSO, available from DuPont, Wilmington, DE.

| Example Ink Receptive Layer II | |
|---|---|
| Material | Wt. % |
| calcium carbonate | 50 |
| polyvinyl alcohol[1] | 21 |
| polyvinyl acetate homopolymer[2] | 9.3 |
| water | 15.4 |
| isopropyl alcohol | 4.2 |
| Keyamine violet KB 220%, diazo dye | 0.04 |
| Zonyl FSO, fluorosurfactant | 0.03 |

[1]PVA 52-22, 16.83% solution of polyvinyl alcohol in water
[2]XR-2223, polyvinyl acetate homopolymer

| Example Ink Receptive Layer III | |
|---|---|
| Material | Wt % |
| water | 50.0 |
| polyethylene dispersion[1] | 27.8 |
| polyvinyl alcohol[2] | 22.2 |

[1]SL-300, polyethylene dispersion
[2]PVA 51-05, 25% solution of polyvinyl alcohol in water

| Example Ink Receptive Layer IV | |
|---|---|
| Material | Wt % |
| calcium carbonate | 7.73 |
| polyvinyl alcohol[1] | 25.76 |
| water | 66.51 |

[1]PVA 51-05, 25% solution of polyvinyl alcohol in water

-continued

Example Ink Receptive Layer V

| Material | Wt % |
|---|---|
| polyethylene dispersion[1] | 21.3 |
| calcium carbonate | 6.6 |
| polyvinyl alcohol[2] | 34.1 |
| water | 38 |

[1]SL-300, polyethylene dispersion
[2]PVA 51-05, 25% solution of polyvinyl alcohol in water Example Ink Receptive Layer VI

| Material | Wt % |
|---|---|
| polyvinyl alcohol in water[1] | 42.03 |
| water | 30.80 |
| polyvinyl acetate homopolymer[2] | 18.55 |
| isopropyl alcohol | 8.48 |
| Keyamine violet KB 220%, diazo dye | 0.08 |
| fluorosurfactant[3] | 0.06 |

[1]PVA 52-22, 16.83% solution of polyvinyl alcohol in water
[2]XR-2223, polyvinyl acetate homopolymer
[3]Zonyl FSO, fluorosurfactant III. Photosensitive Layer or Layers The photosensitive layer or layers of the present invention are typically photosensitive resist layers, meaning that after exposure to light and development portions of the photosensitive layer functions as a mask or resist layer to prevent particulate etching (or other etching) of the substrate onto which the photosensitive layer has been applied.

In some implementations the photosensitive layer comprises a photo crosslinked, aqueous developed polyvinyl alcohol-based polymeric resin. For example, the photosensitive layer can contain from 1 to 40 weight percent of a polymeric photosensitive resin and from 30 to 98 weight percent of a polyvinyl acetate based upon the total dry weight of the photosensitive layer. Alternatively, the photosensitive layer comprises from 1 to 40 weight percent of the polymeric photosensitive resin and from 60 to 98 weight percent of the polyvinyl acetate based upon their combined weights.

In certain implementations the photosensitive laminate contains at least two photosensitive layers, including a first tacky photosensitive layer and a second substantially non-tacky photosensitive layer. The tacky photosensitive layer provides adhesion to a substrate, such as a substrate that is to be etched. The photosensitive layer comprises a pressure sensitive adhesive composition having a $T_g$ of less than about −40° C.

Suitable photosensitive resist layers made in accordance with the invention are described below as examples.

Example Photosensitive Tacky Layer I

| Material | Wt % |
|---|---|
| polyvinyl acetate copolymer pressure sensitive adhesive[1] | 44.9 |
| polyvinyl alcohol grafted with SBQ[2] | 19.1 |
| water | 15.8 |
| plasticizers, benzoate esters[3] | 14.4 |
| glycerin | 5.1 |
| Zonyl FSO, fluorosurfactant | 0.7 |
| Keyamine violet KB 220%, disazo dye | 0.04 |

[1]Flexbond 150, available from Air Products, Allentown, PA. Alternatively, a UV-curable pressure sensitive adhesive (PSA) can be used, or a mixture of a UV-curable and non-UV-curable PSAs can be used.
[2]PVA-SBQ available from Toyo Gosei, Japan.
[3]Benzoflex 50, available from Velsicol Chemical Co., Rosemont, IL.

Example Photosensitive Tacky Layer II

| Material | Wt % |
|---|---|
| UV-curable pressure sensitive adhesive[1] | 15 |
| polyvinyl acetate copolymer pressure sensitive adhesive | 15.36 |
| plasticizers, benzoate esters | 14.56 |
| glycerin | 5.1 |
| polyvinyl acetate, resin emulsion in water | 15 |
| Unisperse Blue G-EN, phthalocyaninato pigment | 0.3 |
| Zonyl FSO, fluorosurfactant | 0.67 |
| water | 17.63 |
| polyvinyl alcohol grafted with SBQ | 16.38 |

[1]Rad-Bond 12PSF5K, available from RAD-CURE Corporation, Fairfield, NJ

Example Photosensitive "Hard" Layer I

| Material | Wt % |
|---|---|
| polyvinyl acetate, resin emulsion in water[1] | 38.19 |
| polyvinyl alcohol grafted with SBQ[2] | 30.07 |
| polyvinyl acetate homopolymer[3] | 8.19 |
| vinyl acetate/ethylene copolymer[4] | 8.19 |
| plasticizer, benzoate esters[5] | 7.50 |
| water | 3.06 |
| glycerin | 2.91 |
| isopropyl alcohol | 1.56 |
| Unisperse Blue G-EN, phthalocyaninato pigment | 0.20 |
| Zonyl FSO, fluorosurfactant | 0.11 |

[1]PN-3178Z, available from H. B. Fuller Company, St. Paul, MN.
[2]540-SBQ, available from Toyo Gosel, Japan.
[3]XR-2223, available from H. B. Fuller Company, St. Paul, MN.
[4]AF-320, available from Air Products, Allentown, PA.
[5]Benzoflex 50, available from Velsicol Chemical Co., Rosemont, IL.

Example Photosensitive "Hard" Layer II

| Material | Wt % |
|---|---|
| polyvinyl acetate, resin emulsion in water[1] | 46.53 |
| polyvinyl alcohol grafted with SBQ[2] | 17.98 |
| polyvinyl acetate homopolymer[3] | 10.52 |
| vinyl acetate/ethylene copolymer[4] | 10.52 |
| plasticizer, benzoate esters[5] | 5.0 |
| water | 3.75 |
| glycerin | 3.30 |
| isopropyl alcohol | 2.07 |
| Unisperse Blue G-EN, phthalocyaninato pigment | 0.21 |
| Zonyl FSO, fluorosurfactant | 0.12 |

[1]PN-3178Z, available from H. B. Fuller Company, St. Paul, MN.
[2]540-SBQ, available from Toyo Gosel, Japan.
[3]XR-2223, available from H. B. Fuller Company, St. Paul, MN.
[4]AF-320, available from Air Products, Allentown, PA.
[5]Benzoflex 50, available from Velsicol Chemical Co., Rosemont, IL.

IV. Carrier Layer

The photosensitive laminate also usually contains a carrier layer. The carrier layer allows easy transport and positioning of the laminate film while also providing support to the other laminate layers. Typically the carrier layer remains on the photosensitive laminate until just before application of the abrasive media. The carrier layer can contain, for example, polyester, biaxially oriented polypropylene, high density polyethylene, low density polyethylene, or other polymer films.

V. Membrane Layer

The photosensitive laminate structure also normally contains a membrane layer. Generally the membrane layer functions as both an anchoring layer to secure the carrier layer to the photosensitive layer, as well as a release layer or release liner between the carrier layer and photosensitive layer. Suitable membrane layers include, for example, polyvinyl alcohols, polyvinyl butyral, polyvinyl formal, polyurethane, nitrocellulose, a polyvinyl pyrrolidone copolymer, and urethane acrylic polymers.

VI. Methods of Using the Photosensitive Laminate

The invention is also directed to methods of exposing a photosensitive laminate without use of a stencil. The invention benefits from ease of use, including the ability to avoid using a stencil as well as the ease of development associated with removal of the water soluble or water degradable ink receptive layer. Also, the invention allows production of high quality resist masks with standard printers.

In some implementations the method comprises providing a multi-layer laminate containing at least one ink receptive, light transmissive layer and one or more photosensitive layers. An image is printed directly onto the ink receptive layer (such as by using an inkjet printer). The image corresponds to those portions of the photosensitive layer that will not be exposed to light. The laminate is subsequently exposed to an appropriate range of wavelengths of light, and then developed.

The laminate is subsequently developed, for example, by spraying with water under pressure. However, other development methods and solvents can be used. The ink receptive layer is preferably dissolvable or removable during development to expose a photosensitive layer, typically the tacky photosensitive layer. Alternatively, the ink receptive material is constructed and arranged to be peelable from the photosensitive layer. In such implementations it may be necessary to apply a release liner between the ink receptive layer and the photosensitive layer.

After the ink receptive layer has been removed along with the excess photosensitive material the remaining portions of the developed laminate can be applied to a substrate for etching. Generally the developed laminate is also briefly dried prior to application to the substrate.

Other embodiments of the invention will be apparent to those skilled in the art from consideration of the specification and practice of the invention disclosed herein. It is intended that the specification and examples be considered as exemplary only, with a full scope and spirit of the invention being indicated by the following claims.

We claim:

1. A method of forming a relief pattern in a photoresist substrate, the method comprising:
   a) providing a photosensitive laminate structure comprising at least an ink receptive, radiation transmissive layer comprising polyvinyl alcohol and inorganic particles, and at least one photosensitive resist layer formed into a single, photosensitive laminate;
   b) printing a pattern on the ink receptive, radiation transmissive layer;
   c) exposing the laminate to actinic radiation to modify the photosensitive resist layer; and
   d) removing a portion of the photosensitive resist layer corresponding to the pattern formed on the ink receptive, radiation transmissive layer.

2. The method according to claim 1, further comprising removing the ink receptive, radiation transmissive layer.

3. The method according to claim 2, wherein the ink receptive, radiation transmissive layer is removed following application of water.

\* \* \* \* \*